United States Patent
Bo et al.

(10) Patent No.: US 7,799,650 B2
(45) Date of Patent: Sep. 21, 2010

(54) METHOD FOR MAKING A TRANSISTOR WITH A STRESSOR

(75) Inventors: Xiangzheng Bo, Austin, TX (US);
Venkat R. Kolagunta, Austin, TX (US);
Konstantin V. Loiko, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 196 days.

(21) Appl. No.: 11/835,547

(22) Filed: Aug. 8, 2007

(65) Prior Publication Data
US 2009/0042351 A1 Feb. 12, 2009

(51) Int. Cl.
*H01L 21/336* (2006.01)

(52) U.S. Cl. .................. 438/303; 438/649; 438/510; 438/563

(58) Field of Classification Search .............. 438/299, 438/303–307, 595, 197, 231, 232, 301, 545, 438/554, 558, 559, 562–564
See application file for complete search history.

(56) References Cited

U.S. PATENT DOCUMENTS

| | | | |
|---|---|---|---|
| 6,214,673 B1 * | 4/2001 | Grebs et al. | 438/274 |
| 6,680,233 B2 | 1/2004 | Yu et al. | |
| 6,727,135 B2 | 4/2004 | Lee et al. | |
| 6,737,710 B2 | 5/2004 | Cheng et al. | |
| 6,777,299 B1 | 8/2004 | Chiu et al. | |
| 6,869,839 B2 | 3/2005 | Lee et al. | |
| 7,316,960 B2 * | 1/2008 | Ting | 438/301 |
| 7,354,838 B2 * | 4/2008 | Kammler et al. | 438/303 |
| 2003/0006410 A1 * | 1/2003 | Doyle | 257/20 |
| 2005/0275034 A1 * | 12/2005 | Deshpande et al. | 257/369 |

OTHER PUBLICATIONS

Chen et al; "Stress Proximity Technique for Performance Improvement with Dual Stress Liner at 45nm Technology and Beyond"; 2006 Symposium on VLSI Technology Digest of Technical Papers.
Taylor, Jr et al; "Single Metal Gate on High-k Gate Stacks for 45nm Low Power CMOS"; Electron Devices Meeting, 2006. IEDM '06. International; Dec. 11-13, 2006 pp. 1-4.

* cited by examiner

*Primary Examiner*—Zandra Smith
*Assistant Examiner*—Telly D Green
(74) *Attorney, Agent, or Firm*—James L. Clingan, Jr.; Ranjeev Singh

(57) ABSTRACT

A method for forming a semiconductor device on a semiconductor material layer includes forming a gate structure over the semiconductor material layer. The method further includes forming a first nitride spacer adjacent to the gate structure and forming source/drain extensions in the semiconductor material layer. The method further includes forming an oxide liner overlying the gate structure and the source/drain extensions. The method further includes forming a second nitride spacer adjacent to the oxide liner. The method further includes forming source/drain regions in the semiconductor material layer. The method further includes using an etching process that is selective to the oxide liner, removing the second nitride spacer. The method further includes using an etching process that is selective to the first nitride spacer, at least partially removing the oxide liner. The method further includes forming silicide regions overlying the source/drain regions and the gate structure.

16 Claims, 6 Drawing Sheets

_US 7,799,650 B2_

METHOD FOR MAKING A TRANSISTOR WITH A STRESSOR

BACKGROUND

1. Field

This disclosure relates generally to semiconductor devices, and more specifically, to making transistors with a stressor.

2. Related Art

Increasing stress in the channel of MOS transistors has been found to improve performance by increasing carrier mobility. In the case of N channel transistors the improvement is found by increasing tensile stress. In the case of P channel transistors the improvement is found by increasing compressive stress. One technique for doing this is to provide a stressor layer of dielectric material over the gate and source drain after the transistor has been formed. This is convenient because there must be a dielectric layer over the transistor anyway to separate it from overlying interconnect layers. One desire is for the stressor layer to be as close as possible to the channel to provide as much as stress to the channel as possible. Techniques for doing this have had some difficulties due to causing adverse effects when removing sidewall spacers.

Thus there is a need for providing a stressor in close proximity to the channel in which the process avoids or reduces the adverse impact of doing so.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a gate has a sidewall spacer of an inner layer of nitride, an intermediate layer of oxide, and an outer layer of nitride. These different layers are used for masking the deep source/drain implant and the extension implant. The outer nitride layer is removed using the intermediate oxide layer as an etch stop layer. The intermediate oxide layer is removed selective to the underlying inner nitride layer so that the inner nitride layer remains. A silicide is formed over the source/drain regions and the gate using the inner nitride layer as mask. The stressor layer is then applied over the gate and source/drains so that the relatively thick outer nitride layer and the intermediate oxide layer are not separating the stressor layer from the channel. The result is close coupling of the stress of the stressor layer to the channel which is beneficial in further improving carrier mobility of the transistor.

Figure 1:
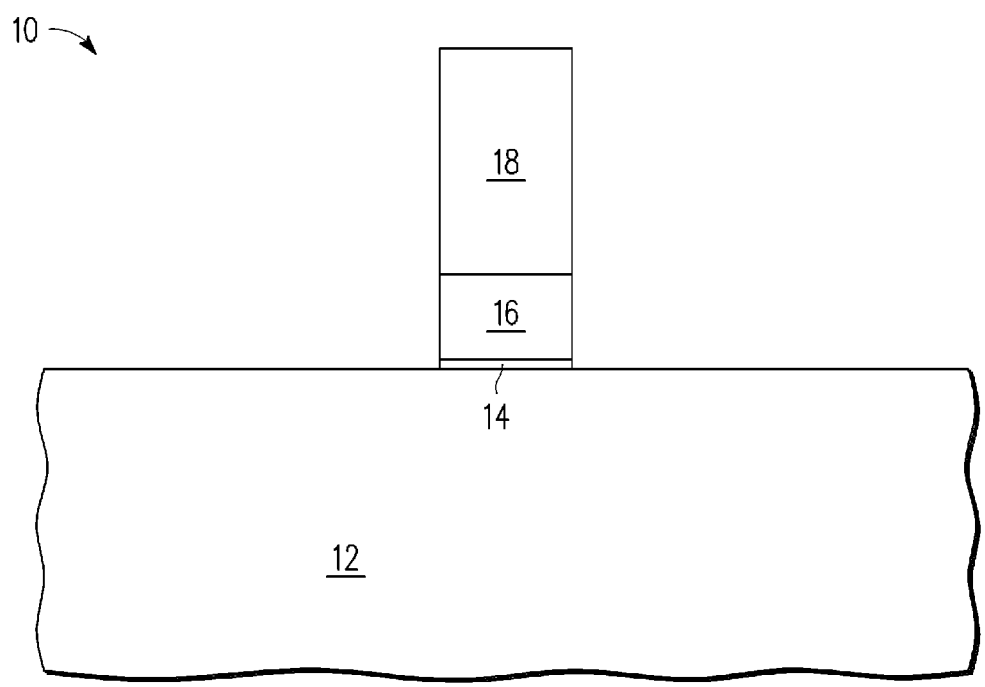
FIG. 1 is a cross section of a semiconductor device at a stage in a process of a first embodiment.

Shown in FIG. 1 is a semiconductor device 10 comprising a substrate 12, a gate dielectric 14 on substrate 12, a metal gate 16 on gate dielectric 14, and a polysilicon portion 18 on metal gate 16. Polysilicon portion 18 and metal gate 16 together or separately may be considered a gate electrode or gate structure. Gate dielectric 14 and a gate electrode together may be considered a gate stack. Metal gate 16 may further be comprised of one or more metal layers. Gate dielectric 14 is preferably a high k dielectric such as a metal oxide, but may also be silicon oxide (oxide) or some combination of dielectric materials. For example, in the case of a metal oxide, there may also be some silicon oxide. In this described example, polysilicon portion 18 is about 800 Angstroms in height and about 350 Angstroms in the lateral dimension, metal gate 16 is about 200 Angstroms in height and the same as polysilicon portion 18 in the lateral dimension, and gate dielectric 14 is about 30 Angstroms for a metal oxide. These dimensions may vary greatly and are generally expected to become smaller as further technological developments in semiconductor processing occur.

Figure 2:
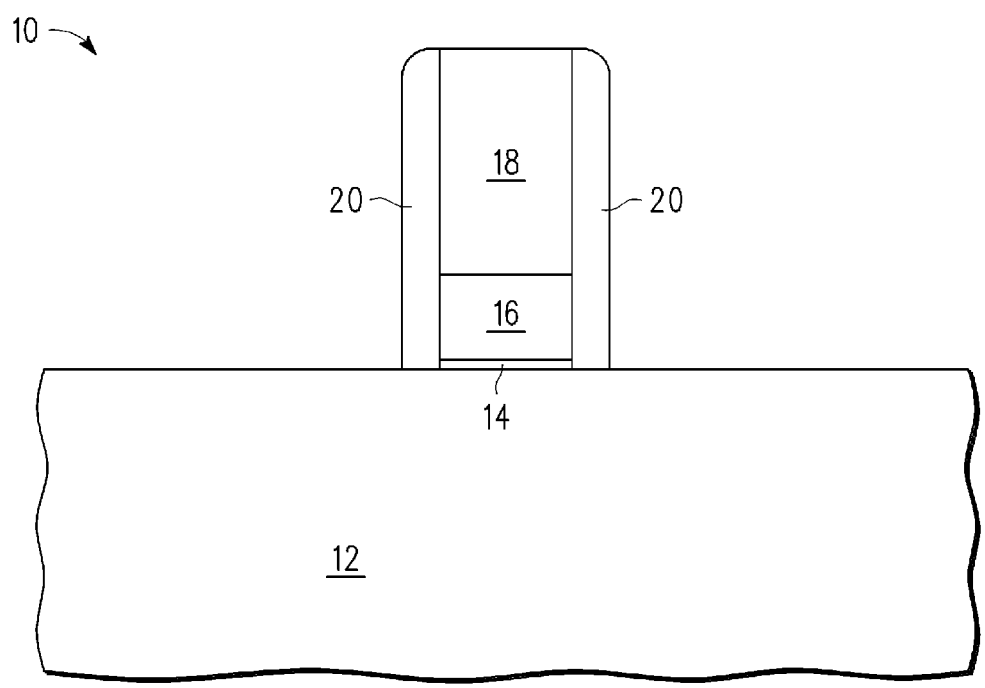
FIG. 2 is a cross section of the semiconductor device of FIG. 1 at a subsequent stage in the process; . . .

Shown in FIG. 2 is semiconductor device 10 after forming a sidewall spacer 20 around the gate stack. This is achieved by a relatively conformal deposition followed by an anisotropic etch back which is typical for sidewall spacer formation. Sidewall spacer 20 is preferably silicon nitride (nitride). It has benefits of being a commonly used material for use as a sidewall spacer and being substantially unaffected by etchants used for etching oxide. It also functions as a diffusion barrier for metal gate 16 and gate dielectric 14. In this example, the thickness of sidewall spacer 20 is about 80 Angstroms. It is preferable to be less than 90 Angstroms.

Figure 3:
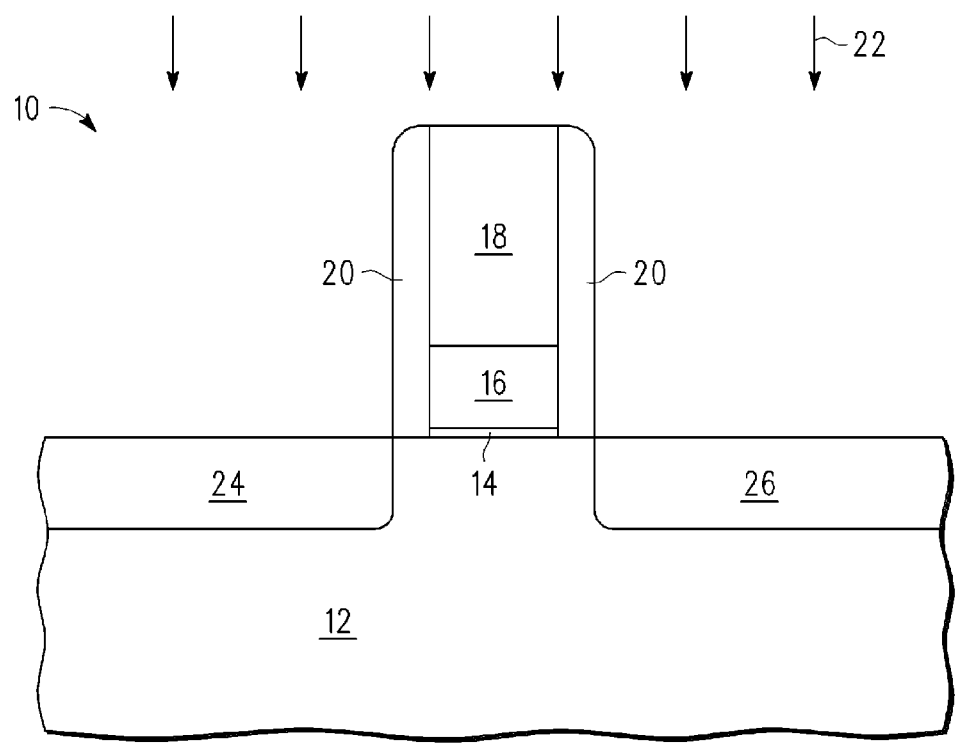
FIG. 3 is a cross section of the semiconductor device of FIG. 2 at a subsequent stage in the process; . . .

Shown in FIG. 3 is semiconductor device 10 after an extension implant 22 that causes formation of source/drain extensions 24 and 26 in substrate 12 aligned to sidewall spacer 20. The gate stack and sidewall spacer 20 act as a mask for implant 22. The particular implant species depends on the transistor being formed, which may be either N channel or P channel.

Figure 4:
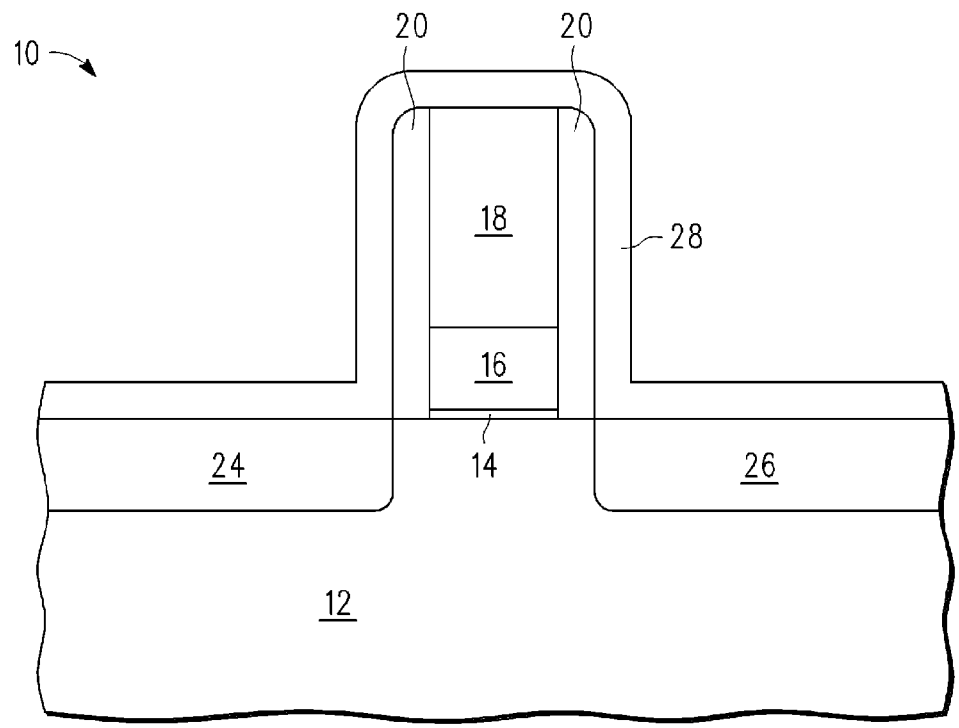
FIG. 4 is a cross section of the semiconductor device of FIG. 3 at a subsequent stage in the process; . . .

Shown in FIG. 4 is semiconductor device 10 after forming a liner 28 of oxide overlying the top of polysilicon portion 18, sidewall spacer 20, and source/drain extensions 24 and 26. In this example oxide layer is about 80 Angstroms in thickness and deposited by plasma enhanced chemical vapor deposition (PECVD).

Figure 5:
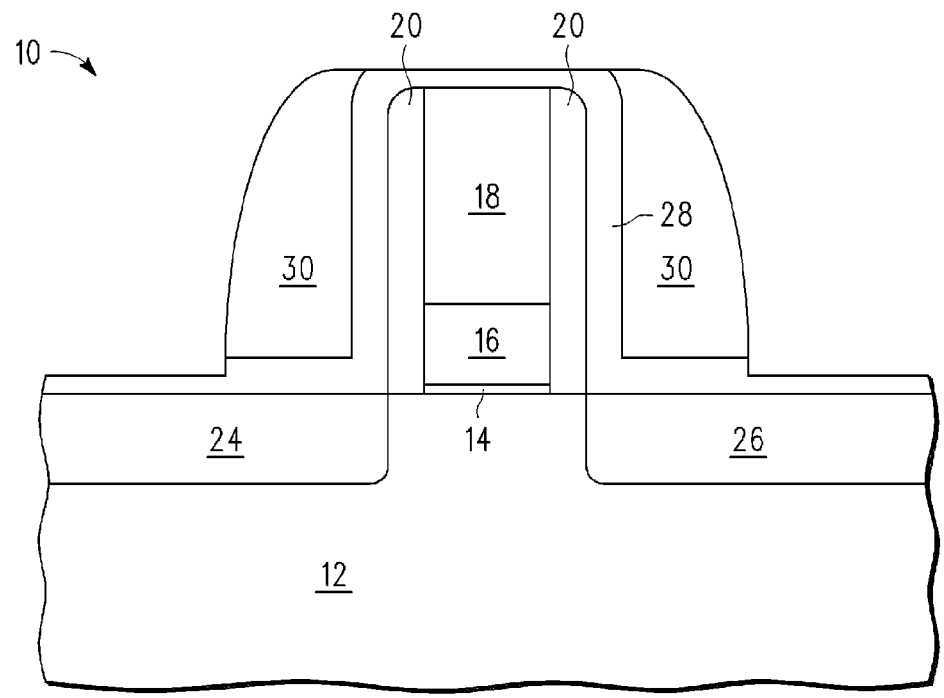
FIG. 5 is a cross section of the semiconductor device of FIG. 4 at a subsequent stage in the process; . . .

Shown in FIG. 5 is semiconductor device 10 after forming a nitride sidewall spacer 30 around the gate stack and on oxide liner 28. Thus, spacer 30 is adjacent to oxide liner 28. Sidewall spacer is formed in the typical process of conformal deposition followed by anisotropic etch back. The particular chemistry used may be any used for nitride sidewall spacer formation which is a common process. The exposed portion of liner 28 will also be etched back a small amount because the anisotropic etch used for etching nitride is not completely selective to oxide. Sidewall spacer is about 300 Angstroms in width in this example. It is much thicker than liner 28 and sidewall spacer 20.

Figure 6:
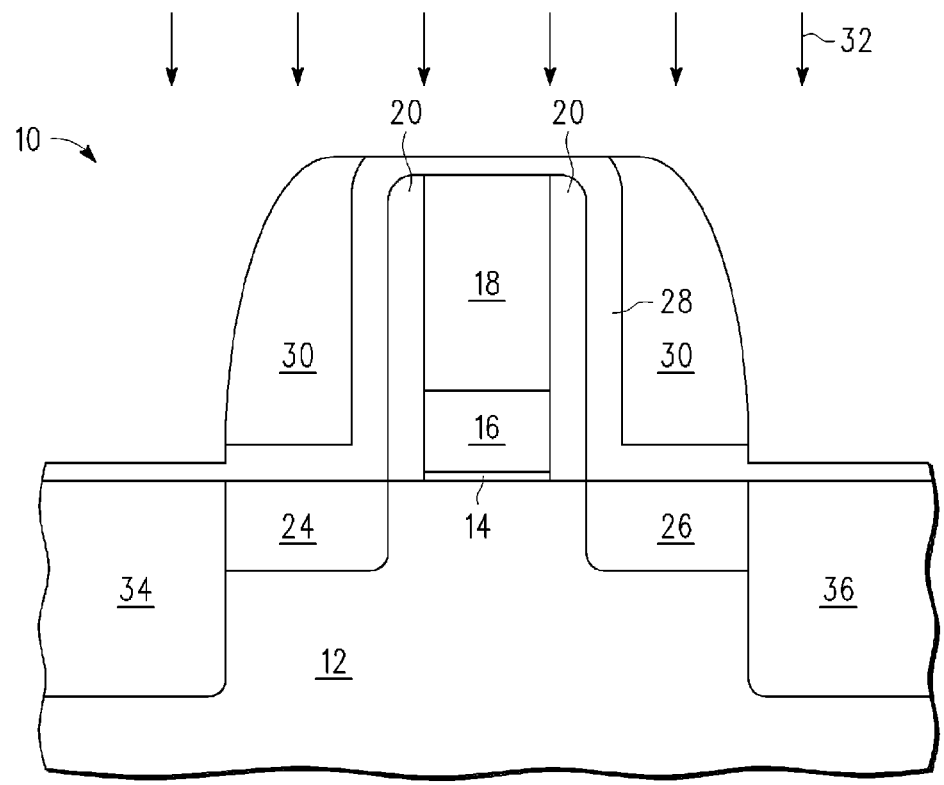
FIG. 6 is a cross section of the semiconductor device of FIG. 5 at a subsequent stage in the process; . . .

Shown in FIG. 6 is semiconductor device 10 after performing a deep source/drain implant 32 causing the formation of deep source/drain regions 34 and 36 in substrate 12 aligned to outer edges of sidewall spacer 30. Sidewall spacer 30 functions as a mask during implant 32. The species of implant 32 is based on whether the transistor being formed is N or P channel.

Figure 7:
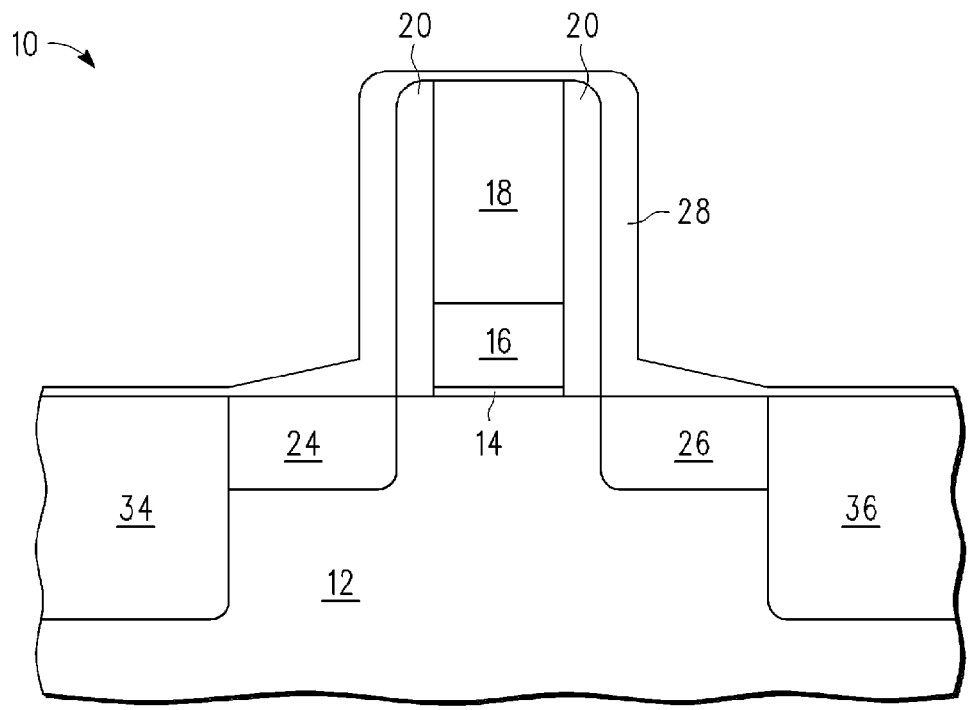
FIG. 7 is a cross section of the semiconductor device of FIG. 6 at a subsequent stage in the process; . . .

Shown in FIG. 7 is semiconductor device 10 after removing sidewall spacer 30. This is preferably a hot phosphoric acid wet etch. Liner 28 functions as an etch stop for this etch. A dry etch may also be used and would preferably be isotropic. Although oxide is selective to this etch chemistry, there is some removal of liner 28, but it is not enough to expose source/drain extensions 24 and 26. An anneal may be performed prior to removing nitride spacer 30 to increase the selectivity of oxide liner 28 to the hot phosphoric acid.

Figure 8:
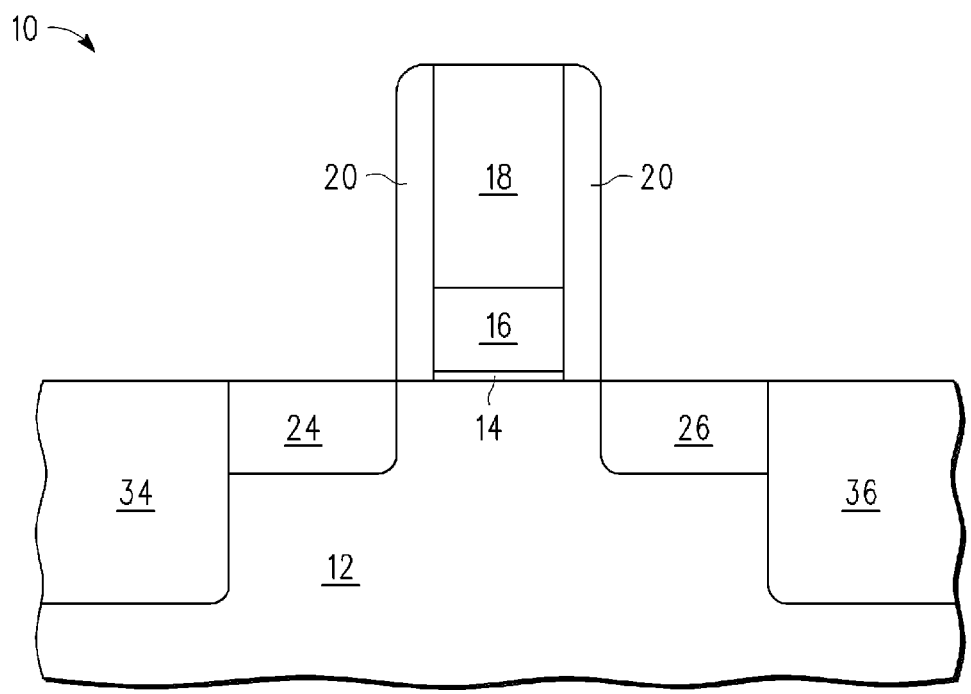
FIG. 8 is a cross section of the semiconductor device of FIG. 7 at a subsequent stage in the process; . . .

Shown in FIG. 8 is semiconductor device 10 after removing liner 28. Liner 28 is removed, in this example, by wet hydrofluoric (HF) acid. This is highly selectively to nitride. With the etch being highly selective and liner 28 being relatively thin, nitride spacer 20 is substantially unaffected by this etch. An alternative is to leave liner 28 on the sides of sidewall spacer 20 while removing the portion extending over source/drain regions 24, 26, 34, and 36 by using an anisotropic etch. The result would be a thicker sidewall spacer for providing more margin in subsequent steps.

Figure 9:
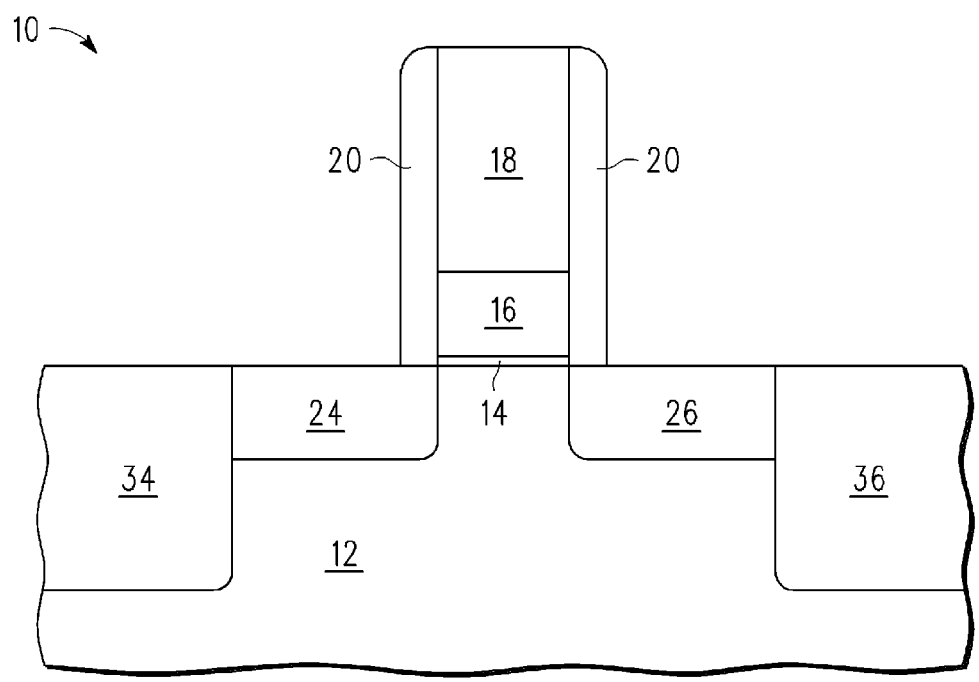
FIG. 9 is a cross section of the semiconductor device of FIG. 8 at a subsequent stage in the process; . . .

Shown in FIG. 9 is semiconductor device 10 after an anneal which has the affect of extending source/drain extensions 24 and 26 to a location near the edges of the of metal gate 16. The region in substrate 12 between source/drain extensions 24 and 26 is the channel of the transistor which is also under the gate electrode of metal gate 16 and polysilicon portion 18. Gate dielectric 14 separates the channel from the gate electrode. This anneal may not be necessary if previous steps in the process after the deep source/drain implant 32 have been sufficient to activate implants 22 and 32. Further the anneal may occur at another time after implant 32. With the source/drain implants 22 and 32 activated semiconductor device 10 in FIG. 9 is a fully functional transistor. Contacts, however, are needed for accessing the source/drains and gate electrode.

Figure 10:
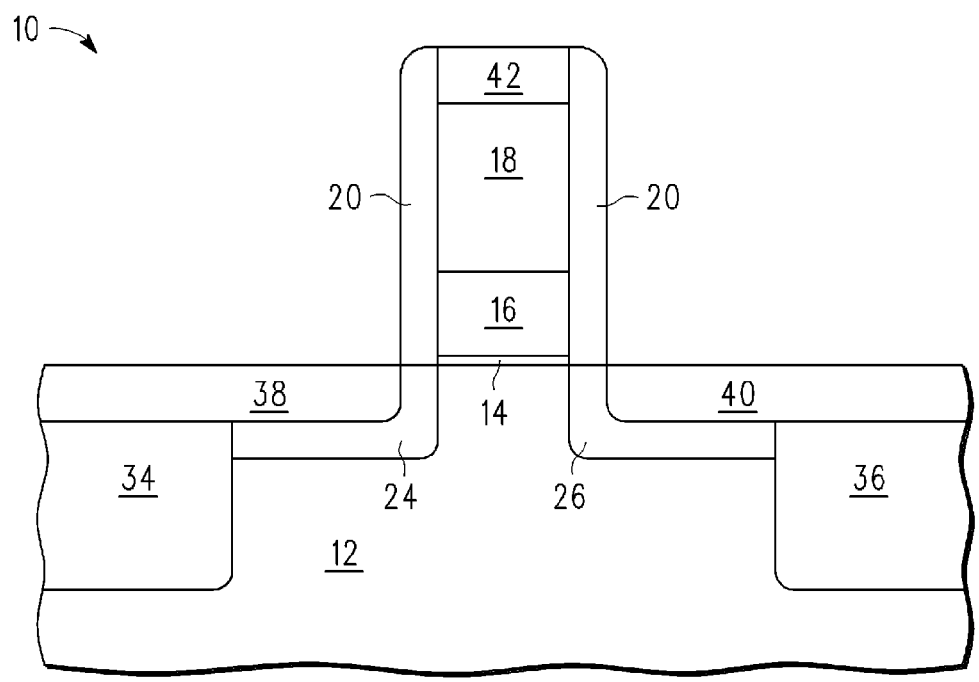
FIG. 10 is a cross section of the semiconductor device of FIG. 9 at a subsequent stage in the process; . . .

Shown in FIG. 10 is semiconductor device 10 after forming silicide region 38 on the top surface of source/drain extension 24 and deep source/drain 34. With sidewall spacer 20 remaining after the removal of oxide liner 28, silicide region 38 is ensured of being spaced from the channel. Similarly a silicide region 40 is formed on the top surface of source/drain extension 26 and deep source/drain 36. A silicide region 42 is also formed on the top surface of polysilicon portion 18. Silicide regions 38, 40, and 42 provide low resistance contact regions as well as reducing gate and source/drain resistance. To increase the margin for ensuring silicide regions 38 and 40 do not encroach into the channel, the alternative of performing an anisotropic etch of oxide liner 28 described for FIG. 8 may be used.

Figure 11:
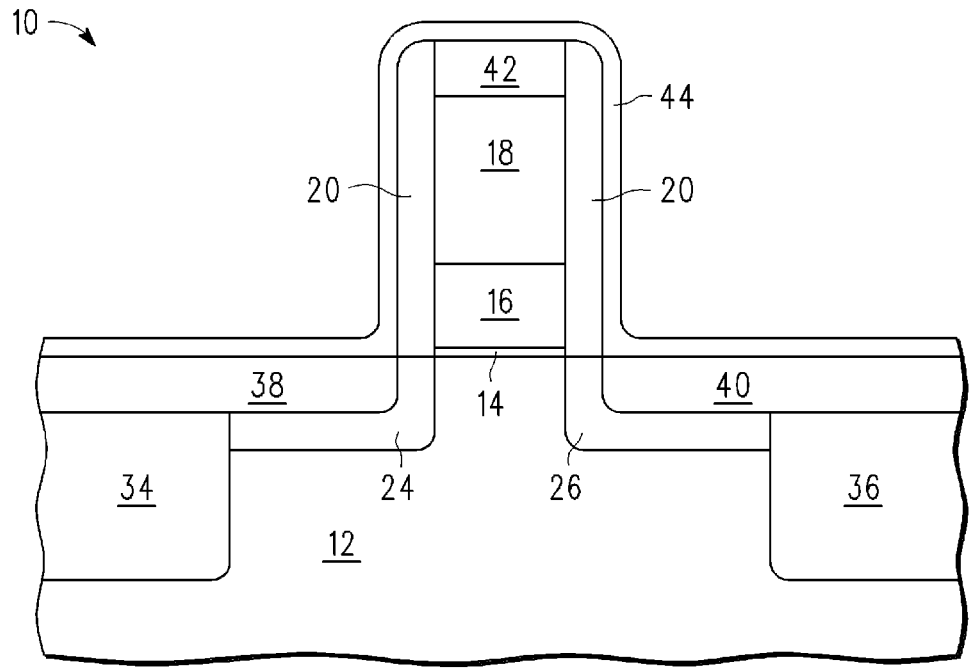
FIG. 11 is a cross section of the semiconductor device of FIG. 10 at a subsequent stage in the process.

Shown in FIG. 11 is semiconductor device 10 after depositing an oxide layer 44 over silicide regions 38, 40, and 42 and sidewall spacer 20. Oxide layer 44 is useful as an etch stop layer for the case where both P and N channel transistors are present and where they will have different stressors. Such a case is sometimes called dual stressor. Thus, if only one type or the other is going to have a stressor, oxide layer 44 may not be necessary. Oxide layer in this example is chosen to be about 50 Angstroms. It is made sufficiently thick to be effective as an etch stop layer but need not be any thicker.

Figure 12:
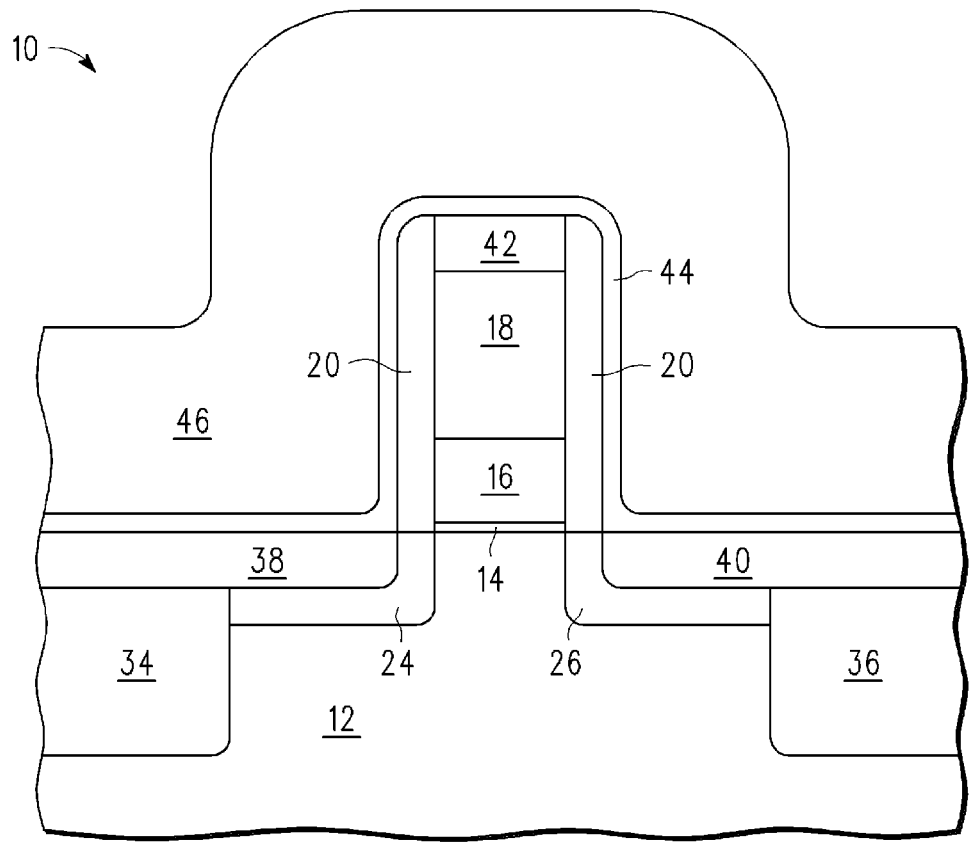
FIG. 12 is a cross section of the semiconductor device of FIG. 11 at a subsequent stage in the process; . . .

Shown in FIG. 12 is semiconductor device 10 after depositing a stressor layer 46 of nitride. Nitride can be deposited as either compressive or tensile. Thus stressor layer 46 can be used, depending upon whether it is chosen to be tensile or compressive, to enhance the performance of either a P channel or an N channel transistor. Stressor layer 46 is about 600 Angstroms thick in this example. The amount of stress depends on the thickness, but a greater thickness of layer 46 can cause issues related to etching and making contacts through the layer. Thus the limit on thickness may be variable based on the issues related to forming contacts.

One reason that the resulting structure of FIG. 12 is desirable is because stressor layer 46 is in close proximity to the channel and thus provides a good stress transfer to the channel. Also nitride layer 20 need not be removed. Another benefit is that the method for achieving the structure of FIG. 12 utilizes materials, nitride and oxide, that are very commonly used in semiconductor manufacturing. A further benefit is that the individual process steps are of the type well known in semiconductor manufacturing.

Semiconductor substrate 12 described herein can be any semiconductor material or combinations of materials, such as gallium arsenide, silicon germanium, silicon-on-insulator (SOI), silicon, monocrystalline silicon, the like, and combinations of the above. In the case of being a bulk substrate as well as SOI, the top portion may be considered a semiconductor material layer.

By now it should be appreciated that there has been provided a method for forming a semiconductor device on a semiconductor material layer. The method includes forming a gate structure over the semiconductor material layer. The method includes forming a first nitride spacer adjacent to the gate structure. The method includes forming source/drain extensions in the semiconductor material layer. The method includes forming an oxide liner overlying the gate structure and the source/drain extensions. The method includes forming a second nitride spacer adjacent to the oxide liner. The method includes forming source/drain regions in the semiconductor material layer. The method includes using an etching process that is selective to the oxide liner, removing the second nitride spacer. The method includes using an etching process that is selective to the first nitride spacer, at least partially removing the oxide liner. The method includes forming silicide regions overlying the source/drain regions and the gate structure. The method includes forming a stressor layer overlying the silicide regions and the first nitride spacer to generate stress in a channel region of the semiconductor device. The method may be further characterized by the gate structure comprising a gate dielectric layer, a metal gate layer, and a polysilicon layer. The method may be further characterized by the step of using the etching process that is selective to the oxide liner, further comprising etching the second nitride spacer using an etchant having an etch chemistry such that the etchant has a minimal effect on the oxide liner. The method may be further characterized by the step of using the etching process that is selective to the first nitride spacer further comprising etching the oxide liner using an etchant having an etch chemistry such that the etchant has a minimal effect on the first nitride spacer. The method may further comprise performing a hydrofluoric acid (HF) clean after removing the oxide liner and before forming the silicide regions. The method may further comprise annealing the source/drain regions after forming the source/drain regions. The method may be further characterized by the step of forming the first nitride spacer being further characterized by a thickness of the first nitride spacer is selected in a manner that the silicide regions do not extend into the channel region of the semiconductor device. The method may further comprise forming a second oxide liner overlying the silicide regions and the gate structure prior to forming the stressor layer.

Also described is a method for forming a semiconductor device over a semiconductor material layer. The method includes forming a gate structure over the semiconductor material layer. The method includes forming a first nitride spacer adjacent to the gate structure. The method includes forming source/drain extensions in the semiconductor material layer. The method includes forming an oxide liner overlying the gate structure and the source/drain extensions. The method includes forming a second nitride spacer adjacent to the oxide liner. The method includes forming source/drain regions in the semiconductor material layer. The method includes etching the second nitride spacer using an etchant having an etch chemistry such that the etchant has a minimal effect on the oxide liner The method includes etching the oxide liner using an etchant having an etch chemistry such that the etchant has a minimal effect on the first nitride spacer. The method includes forming silicide regions overlying the source/drain regions and the gate structure. The method may be further characterized by the gate structure comprising a gate dielectric layer, a metal gate layer, and a polysilicon layer. The method may further comprise performing a hydrofluoric acid (HF) clean after etching the oxide liner and before forming the silicide regions. The method may further comprise annealing the source/drain regions after forming the source/drain regions. The method may be further characterized by a thickness of the first nitride spacer is selected in a manner that the silicide regions do not extend into a channel region of the semiconductor device. The method may further comprise forming a stressor layer overlying the silicide regions and the first nitride spacer to generate stress in a channel region of the semiconductor device. The method may further comprise forming a second oxide liner overlying the silicide regions and the gate structure prior to forming the stressor layer.

Yet also described is a method for forming a semiconductor device over a semiconductor material layer. The method includes forming a gate structure over the semiconductor material layer. The method includes forming a first nitride spacer adjacent to the gate structure The method includes forming source/drain extensions in the semiconductor material layer. The method includes forming an oxide liner overlying the gate structure and the source/drain extensions. The method includes forming a second nitride spacer adjacent to the oxide liner. The method includes forming source/drain regions in the semiconductor material layer. The method includes using an etching process that is selective to the oxide liner, removing the second nitride spacer. The method includes using an etching process that is selective to the first nitride spacer, at least partially removing the oxide liner. The method includes forming silicide regions overlying the source/drain regions and the gate structure, wherein a thickness of the first nitride spacer and a thickness of a remaining oxide liner is selected in a manner that the silicide regions do not extend into a channel region of the semiconductor device. The method includes forming a stressor layer overlying the silicide regions and the first nitride spacer to generate stress in the channel region of the semiconductor device. The method may be further characterized by the step of using the etching process that is selective to the oxide liner, further comprising etching the second nitride spacer using an etchant having an etch chemistry such that the etchant has a minimal effect on the oxide liner. The method may be further characterized by the step of using the etching process that is selective to the first nitride spacer, further comprising etching the oxide liner using an etchant having an etch chemistry such that the etchant has a minimal effect on the first nitride spacer. The method may further comprise forming a second oxide liner overlying the silicide regions and the gate structure prior to forming the stressor layer. The method may be further characterized by the thickness of the first nitride spacer is less than 90 Angstroms.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, specific dimensions were provided and they may be changed. Also certain materials were specified in some cases and they may be varied. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for forming a semiconductor device on a semiconductor material layer, comprising:
    forming a gate structure over the semiconductor material layer having a metal layer directly on a gate dielectric;
    forming a first nitride spacer directly on the gate structure, wherein the first nitride spacer has a width less than 90 Angstroms;
    forming source/drain extensions in the semiconductor material layer using the nitride spacer as a mask;
    forming an oxide liner overlying the gate structure and the source/drain extensions and directly on the first nitride spacer;
    forming a second nitride spacer directly on the oxide liner;
    forming source/drain regions in the semiconductor material layer using the second nitride spacer as a mask;
    using an etching process that is selective to the oxide liner, removing the second nitride spacer;
    using an etching process that is selective to the first nitride spacer, at least partially removing the oxide liner;
    forming silicide regions overlying the source/drain regions and the gate structure; and
    forming a stressor layer overlying the silicide regions and the first nitride spacer to generate stress in a channel region of the semiconductor device.

2. The method of claim 1, wherein the gate structure further comprises a polysilicon layer over the metal layer.

3. The method of claim 1, wherein the step of using the etching process that is selective to the oxide liner, removing the second nitride spacer further comprises etching the second nitride spacer using an etchant having an etch chemistry such that the etchant has a minimal effect on the oxide liner.

4. The method of claim 1, wherein the step of using the etching process that is selective to the first nitride spacer, at least partially removing the oxide liner further comprises etching the oxide liner using an etchant having an etch chemistry such that the etchant has a minimal effect on the first nitride spacer.

5. The method of claim 1 further comprising performing a hydrofluoric acid (HF) clean after removing the oxide liner and before forming the silicide regions.

6. The method of claim 1 further comprising annealing the source/drain regions after forming the source/drain regions.

7. The method of claim 1 further comprising forming a second oxide liner overlying the silicide regions and the gate structure prior to forming the stressor layer.

8. A method for forming a semiconductor device over a semiconductor material layer, comprising:
    forming a gate structure over the semiconductor material layer having a metal on a gate dielectric;
    forming a first nitride spacer on the gate structure, wherein the first nitride spacer has a width less than 90 Angstroms;
    forming source/drain extensions in the semiconductor material layer substantially aligned to the first nitride spacer;
    forming an oxide liner directly on the gate structure and the source/drain extensions;
    forming a second nitride spacer directly on the oxide liner;
    forming source/drain regions in the semiconductor material layer;
    performing an anneal to extend the source/drain extensions
    etching the second nitride spacer using an etchant having an etch chemistry such that the etchant has a minimal effect on the oxide liner;
    etching the oxide liner using an etchant having an etch chemistry such that the etchant has a minimal effect on the first nitride spacer;
    forming silicide regions overlying the source/drain regions and the gate structure substantially aligned to the first nitride spacer; and
    forming a stressor layer over the gate structure and the silicide regions after etching the oxide liner.

9. The method of claim 8, wherein the gate structure further comprises a polysilicon layer on the metal.

10. The method of claim 8 further comprising performing a hydrofluoric acid (HF) clean after etching the oxide liner and before forming the silicide regions.

11. The method of claim 8, wherein a thickness of the first nitride spacer is selected in a manner that the silicide regions do not extend into a channel region of the semiconductor device.

12. The method of claim 8 further comprising forming a second oxide liner overlying the silicide regions and the gate structure prior to forming the stressor layer and after forming the silicide regions.

13. A method for forming a semiconductor device over a semiconductor material layer, comprising:
    forming a gate structure over the semiconductor material layer having a metal on a gate dielectric;
    forming a first nitride spacer directly on the gate structure, wherein the first nitride spacer has a width less than 90 Angstroms;
    forming source/drain extensions in the semiconductor material layer;
    forming an oxide liner directly on the gate structure and overlying the source/drain extensions;
    forming a second nitride spacer directly on the oxide liner;
    forming source/drain regions in the semiconductor material layer;
    performing an anneal to extend the source/drain extensions
    using an etching process that is selective to the oxide liner, removing the second nitride spacer;
    using an etching process that is selective to the first nitride spacer, at least partially removing the oxide liner;
    forming silicide regions using the first nitride spacer as a mask overlying the source/drain regions and the gate structure, wherein the width of the first nitride spacer and a width of a remaining oxide liner is selected in a manner that the silicide regions do not extend into a channel region of the semiconductor device; and
    forming a stressor layer overlying the silicide regions and the first nitride spacer to generate stress in the channel region of the semiconductor device.

14. The method of claim 13, wherein the step of using the etching process that is selective to the oxide liner further comprises etching the second nitride spacer using an etchant having an etch chemistry such that the etchant has a minimal effect on the oxide liner.

15. The method of claim 13, wherein the step of using the etching process that is selective to the first nitride spacer, further comprises etching the oxide liner using an etchant having an etch chemistry such that the etchant has a minimal effect on the first nitride spacer.

16. The method of claim 13 further comprising forming a second oxide liner overlying the silicide regions and the gate structure prior to forming the stressor layer.

* * * * *